US006765793B2

(12) United States Patent
Kehret et al.

(10) Patent No.: US 6,765,793 B2
(45) Date of Patent: Jul. 20, 2004

(54) RUGGEDIZED ELECTRONICS ENCLOSURE

(75) Inventors: William E. Kehret, Oakland, CA (US); Dennis H. Smith, Fremont, CA (US)

(73) Assignee: Themis Corporation, Fremont, CA (US)

( * ) Notice: Subject to any disclaimer, the term of this patent is extended or adjusted under 35 U.S.C. 154(b) by 0 days.

(21) Appl. No.: 10/232,915

(22) Filed: Aug. 30, 2002

(65) Prior Publication Data

US 2004/0042175 A1 Mar. 4, 2004

(51) Int. Cl.[7] .................................................. H05K 7/20

(52) U.S. Cl. ...................... 361/690; 165/80.3; 165/185; 312/326; 361/700; 361/703; 361/704; 361/707; 361/694; 361/695; 361/688; 454/184

(58) Field of Search ................................ 165/80.3, 121, 165/126, 185; 361/683–687, 690, 694–696, 700–710, 724–727; 312/326; 454/184

(56) References Cited

U.S. PATENT DOCUMENTS

| 5,282,114 | A | * | 1/1994 | Stone ......................... 361/695 |
| 5,808,866 | A | * | 9/1998 | Porter ........................ 361/695 |
| 5,999,406 | A | * | 12/1999 | McKain et al. ............. 361/690 |
| 6,215,658 | B1 | * | 4/2001 | Bodini ....................... 361/695 |
| 6,330,152 | B1 | * | 12/2001 | Vos et al. ................... 361/688 |

* cited by examiner

Primary Examiner—Gregory D. Thompson
(74) Attorney, Agent, or Firm—Fenwick & West LLP (57) ABSTRACT

The present invention relates to a ruggedized enclosure for housing and protecting electronics circuits. The enclosure utilizes a top compartment for housing the circuit and a cooling assembly rigidly coupled to the top compartment. The cooling assembly utilizes a passive radiator to form a rigid truss plate structure. The truss plate structure rigidifies the enclosure helping to protect the enclosure and circuit from destructive shock events and destructive vibration events. The cooling assembly further provides an efficient heat exchange for removing heat from the electronic circuit. A method for protecting an electronic circuit utilizing a rigid truss plate structure is also provided.

71 Claims, 7 Drawing Sheets

RUGGEDIZED ELECTRONICS ENCLOSURE

BACKGROUND OF THE INVENTION

1. Field of the Invention

This invention is related to enclosures for electronic circuits and particularly to ruggedized enclosures for use in installations subjected to hostile environments including destructive shock events and destructive vibration events. In one embodiment, the invention may operate without requiring additional mechanical isolation.

2. Description of the Related Art

Conventional ruggedized electronics enclosures are often employed in military applications. The environments in which military electronic circuits must be able to operate typically present conditions outside of a commercial electronic circuit's operational parameters. Examples of such conditions include excessive moisture, salt, heat, vibrations, and mechanical shock. Historically, military electronic equipment was custom made to provide the required survivability in the hostile environments. While effective in surviving the environment, custom equipment is often significantly more expensive than commercial systems, and is typically difficult if not impossible to upgrade to the latest technologies. Therefore, a current trend in conventional military hardware is to adapt commercially available electronics for use in military applications. These systems are typically known as Commercial Off The Shelf systems, or COTS.

The COTS design philosophy has allowed the military to keep current with technological innovations in computers and electronics, without requiring specialized and dedicated electronic circuit board assemblies. The COTS design methodology is attractive because of the rapidly increasing computational power of commercially available, general-purpose computers. Since the components in a COTS system are commercially available, though usually modified to some extent, the military can maintain an upgrade path similar to that of a commercial PC user. Thus the COTS philosophy allows the military to integrate the most potent electronic components available into their current hardware systems.

While COTS systems have allowed the military to reduce the cost of equipment and to make more frequent upgrades to existing equipment, there are inherent disadvantages to COTS systems. As noted above, military applications must be able to withstand various environmental extremes, including humidity, temperature, shock and vibration. These conditions are typically outside of the operating parameters of commercial electronics and, thus, added precautions and modifications to the physical structures of the equipment must be made to ensure reliability of operation in these environments. Conventional COTS systems typically use two specialized modifications to maintain reliability. These approaches may be used separately, or in combination.

To deploy COTS equipment in hazardous environments, COTS components are housed in a complex ruggedized enclosure or case. One approach, sometimes referred to as "cocooning" places a smaller, isolated equipment rack within a larger, hard mounted enclosure. With this approach shock, vibration and other environmental extremes are attenuated by the isolation system to a level that is compatible with COTS equipment. Another approach, sometimes called Rugged, Off The Shelf (ROTS) seeks to "harden" the COTS equipment, in a manner such as to make it immune to the rigors of the extended environmental conditions to which it is exposed. This later approach strengthens the equipment's enclosure and provides added support for internal components. Both cocooning and ROTS design methodologies must also improve cooling efficiency to accommodate higher operating ambient temperatures. Both approaches suffer from added complexity, size, weight and cost.

The size and complexity exacerbates heat-removal from the enclosure and often complex heat flow routes must be devised in order to maintain a desirable operating temperature. Taken together, these design considerations drastically increase the cost and complexity of such an enclosure.

Commercial systems are typically designed around three main criteria, cost, time-to-market and easy expansion. To deliver on all three design goals, the assumption is that the environment for the system will not be exposed to extreme environmental conditions. Cost is the primary motivator to keeping the packaging simple and inexpensive. The package support structures may have a low cost to keep the system cost from escalating. Keeping costs down to a minimum is counter to the requirements of making a system robust enough to survive a military environment.

To easily accommodate system expansion, computer manufacturers try to simplify the installation of peripheral cards, memory and storage. The idea of having a minimum number of fasteners (i.e., a snap-in-place design) allows the customer easy access and installation of peripherals. The design's modularity preserves the customer's investment. When you couple the commercial constraints with the requirements of the military environment, the design requires a different approach, typically moving the structural changes to the system enclosure and it's attachments. The usual cocooning approach is to design the enclosure to absorb as much of the shock as possible to allow the incumbent system to survive the environment. In practice, this is not easily achieved, especially when using larger, and heavier computer systems. Thus, the idea of completely isolating a commercial system from the rigors of the military environment is difficult to achieve and adds a large cost premium because the rack is the item being modified. The current solution to supporting COTS technology in a military environment described above, adds significant complexity to the system.

Two of the most difficult conditions to design for are vibration and mechanical shock. Mechanical shock and vibration may over time destroy electronic equipment by deforming or fracturing enclosures and internal support structures and by causing electrical connectors, circuit card assemblies and other components to fail. In military applications, as well as in commercial avionics and the automotive industry, electronics must be able to operate while being subjected to constant vibrational forces generated by the vehicle engines, or waves, as well as being subjected to sudden, and often drastic, shocks. Examples of such shocks are those generated by bombs, missiles, depth charges, air pockets, potholes, and other impacts typically encountered by military or commercial vessels. Furthermore, these conditions may also be seen in the operating conditions of a network or telephone server during an earthquake. While providing some protection from shock and vibration, the conventional ruggedized enclosure operating alone cannot provide adequate protection for mission-critical electrical components and circuits.

Figure 1:
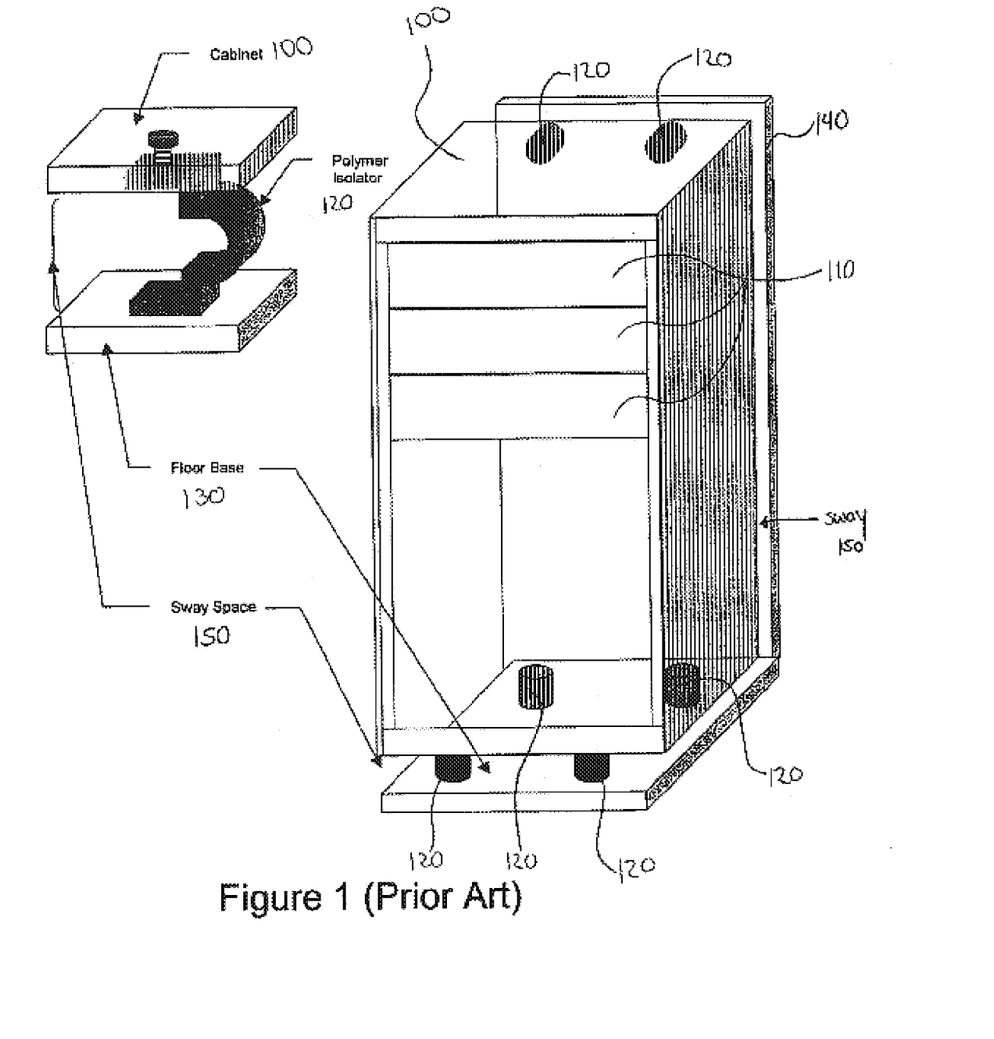
FIG. 1 illustrates a conventional mechanically isolated cocoon system.

In order to provide additional protection against shock and vibration, conventional COTS systems mount the ruggedized enclosures described above in a mechanically isolated cocoon. FIG. 1 illustrates a conventional mechanically isolated cocoon. As illustrated in FIG. 1, a cocoon 100 is provided to house the various ruggedized enclosures 110. The cocoon 100 may be attached to a floor 130 and/or a wall 140 of its surroundings. Commonly this includes the fuselage or deck plate of a military vehicle. The cocoon 100 is attached to the surroundings 130, 140 via mechanical isolators 120. A particularly advanced mechanical isolator 120 is the polymer isolator illustrated in FIG. 1, though conventional systems may use any spring-like apparatus to provide the isolation. By attaching the cocoon 100 to its surroundings 130, 140 via mechanical isolators 120, the cocoon 100 is allowed limited movement with five degrees of freedom. This limited movement helps to dampen the effects of shock and vibration.

There are several drawbacks to using the mechanically isolated cocoon 100. In order to reduce the shock to the equipment, the cocoon 100 must be provided with a sway space 150 in which it may move unobstructed. Typically this sway space 150 is four to seven inches in each direction of movement. Thus the cocoon 100 consumes additional space 150 which might otherwise be utilized for other activities or equipment. In military applications, commercial aircraft, as well as automotive applications, space is often at a premium.

Additionally, while the cocoon 100 does isolate the equipment from some vibration and shock, it does not completely isolate the equipment. For example, a conventional cocoon 100 can receive a 60–80 G shock (a "G" is a unit of force equal to the force exerted by Earth's gravity on a body at rest and is used to indicate the force the equipment is subjected to when accelerated by a shock event) and reduce the shock felt by the equipment to 10–15 G's. Typically the performance of the cocoon 100 is limited by sway space available, materials used, and equipment placement within the cocoon 100. Additionally, if the environment around the cocoon 100 moves more than the sway space 150 can accommodate, then the cocoon 100 and its equipment will feel the entire shock event. While a significant reduction in the shock may be experienced, it is important to note that commercial equipment is frequently rated for 5 G's or less. Thus, there is still a significant chance for failure within the system.

To provide the additional shock protection, conventional COTS systems pair the cocoon 100 with the ruggedized enclosures 110, or cocoon. However, while more effective in protecting the equipment from mechanical shock, these ruggedized enclosures 110 work only when the shock isolation system is carefully integrated with the included systems. Since the enclosure is allowed to move, issues such as weight, position, center of gravity and heat removal all have to be balanced. Thus, the cost and complexity of such a system are significantly higher when compared to a commercial system using similar electrical components.

What is needed is a ruggedized enclosure for use in hostile environments which: 1) provides a simplified and effective heat flow design; 2) may utilize COTS components; 3) does not require the use of a mechanical isolator or sway space; 4) provides a high level of shock and vibration protection without need for augmentation; and 5) may be manufactured at low cost.

SUMMARY OF THE INVENTION

The present invention overcomes the limitations and disadvantages of conventional electronics enclosures used in harsh operating environments. In one embodiment, the invention provides protection from destructive shock events and destructive vibration events without need of external mechanical isolation.

In one embodiment, the electronics enclosure includes a top compartment for housing the electronic circuit, and a cooling assembly attached thereto. The top compartment may be sealed to further protect the electronic circuit from moisture and unwanted particles in the air. The cooling assembly includes a rigid truss plate structure which forms a structural member for rigidifying the enclosure, and also forms an efficient heat radiator for removing heat from the electronic circuit. The truss plate structure achieves it's high strength to weight ratio in a manner similar to conventional "honey-comb" or sandwich structures. The truss plate structure converts bending mode forces, applied to opposing plates, into compression and extension mode forces. However, unlike conventional "honey-comb" or sandwich constructions, the present invention provides ducts or passage ways through which cooling air (or other cooling fluid) is allowed to flow to aid in the efficient removal of heat from the top compartment. In an alternate embodiment, the truss plate structure is a honey-comb truss structure that provides passages through which cooling air (or other cooling fluid) is allowed to flow.

In one embodiment, the rigid truss plate structure is formed from a passive radiator coupled between a heat spreader plate and a bottom plate. The heat spreader plate also forms the bottom of the top enclosure and provides both mechanical and thermal coupling between the top compartment and the cooling assembly. In one embodiment, the passive radiator may be comprised of a corrugated fin. In another embodiment, the passive radiator is comprised of triangularly shaped fins (an A-frame structure). Both the corrugated fin and the triangular fin structure may provide additional protection against destructive shear and twisting of the enclosure. In another embodiment, the passive radiator is comprised of a pin-style heatsink. In one embodiment the pin-style heatsink is arranged according to a pin density pattern to create a turbulence gradient for the cooling assembly.

In one embodiment, the enclosure is rigidified by the truss plate structure in order to protect the electronic circuit against an anticipated destructive shock event. In one embodiment, the enclosure and circuit can withstand and survive a 60 G shock event. In alternate embodiments the enclosure is designed based upon various criteria such that a particular enclosure and enclosed device (e.g., circuit) is designed to withstand and survive shock events in the range of 20 G to at least 60 G depending upon these design criteria. In another embodiment, the enclosure's resonant frequency is raised above an anticipated destructive vibration event. In one embodiment, of special interest for land vehicle or aircraft applications, the enclosure and circuit have a resonant frequency in the range of 200 Hz to at least 1 kHz. In another embodiment, of special interest for shipboard applications, the enclosure and circuit have a resonant frequency in the range of 20 to 40 Hz. The listed ranges are merely exemplary, and alternate embodiments may have a resonant frequency selected to be higher than a known destructive vibration event.

In one embodiment, the cooling assembly further provides heat pipes for drawing away additional heat from the electronic circuit and delivering it to an external heat exchanger. In one embodiment, the heat pipes cooperate with the passive radiator to provide an efficient heat exchanger.

In one embodiment, the electronic enclosure includes the use of microchips. These chips may be placed top-down on the heat spreader plate in order to provide a more efficient heat transfer from the chip to the cooling assembly.

A method for protecting and cooling an electronic circuit via a rigid truss plate structure is also provided.

The features and advantages described in the specification are not all inclusive, and particularly, many additional features and advantages will be apparent to one of ordinary skill in the art in view of the drawings, specification and claims herein. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION

A preferred embodiment of the present invention is now described with reference to the figures where like reference numbers indicate identical or functionally similar elements. Also in the figures, the left most digit(s) of each reference number correspond(s) to the figure in which the reference number is first used.

The present invention relates to a ruggedized electronics enclosure for protecting electronic circuits that must be able to survive and operate under harsh conditions such as those in military and automotive environments. The enclosure must be able to protect the electronic circuits from severe vibration and shock, heat, moisture, dust particulate, and various other adverse conditions. Throughout this description, the word "destructive" will be used to indicate a force or event which may cause the enclosure or the electronic circuit to fail after a single occurrence of the event, or after repeated occurrences of the event between maintenance intervals. Specific destructive events will be discussed in more detail below.

Figure 2:
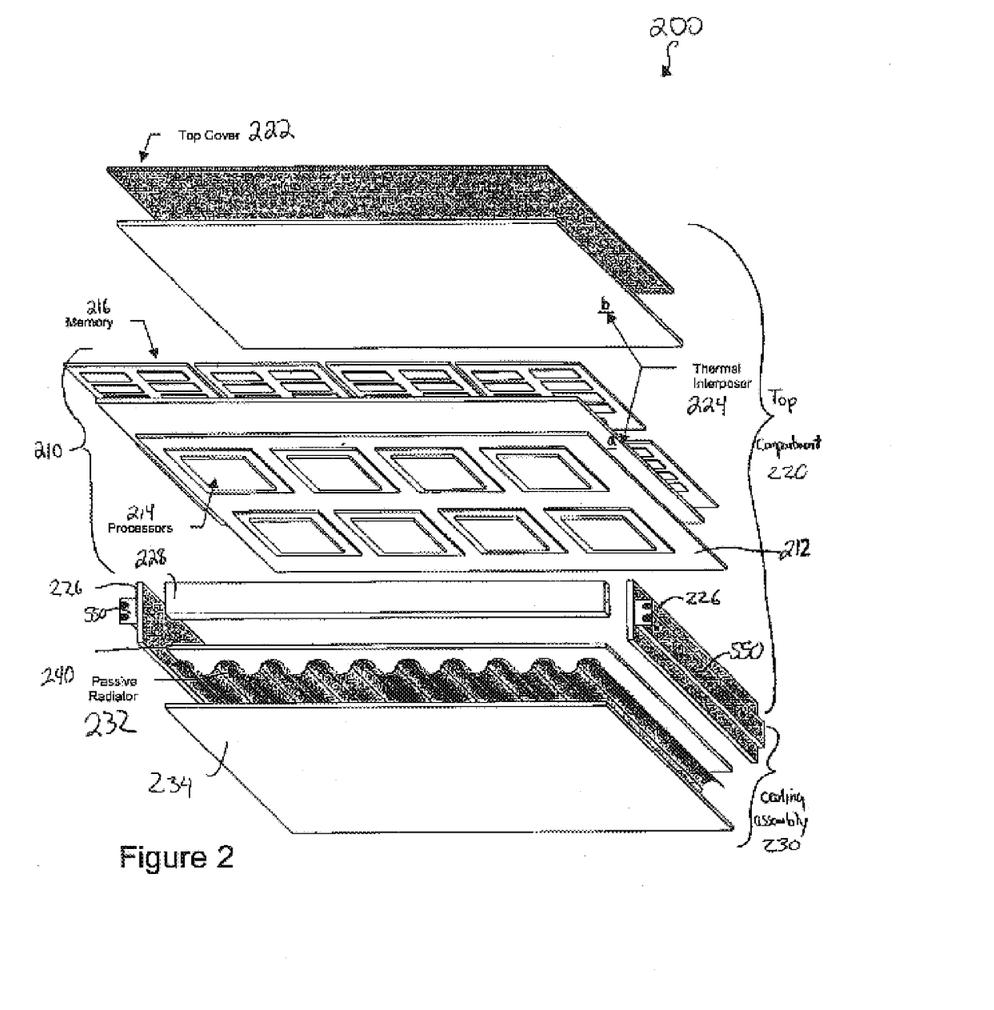
FIG. 2 illustrates an exploded view of a ruggedized electronics enclosure according to one embodiment of the present invention.

FIG. 2 illustrates an exploded view of a ruggedized electronics enclosure 200 according to the present invention. As illustrated in FIG. 2, the enclosure 200 is configured to house and protect a compute element 210. The compute element 210 is chosen by way of example as illustrative of the primary features and operation of the enclosure 200, and one skilled in the art will recognize that the enclosure 200 may be configured to house and protect any electronic circuit. Examples of alternate electronic circuits include various other components used in a computer, ordinance guidance and communication boards, vehicle control modules, radio and communications equipment, radar equipment, etc. As will be discussed below, the enclosure 200 may most advantageously be used for any electronic circuit which may be formed having a low vertical profile, but may be used to add increased protection to any dimensioned electronic circuit.

The ruggedized electronics enclosure 200 includes a top compartment 220 for housing the electronic circuit 210 (illustrated as a compute element), and a cooling assembly 230 coupled to the bottom of the top compartment 220. As illustrated, the enclosure 200 is shaped as a rectangle, however any footprint shape may be used. Non-rectangular shapes may be preferred in applications where space is at a premium, such as in aircraft, or military ordinance.

The top compartment 220 includes a top cover 222, one or more thermal interposers 224, a pair of side walls 226, a front wall 227, a rear wall (not shown) and a heat spreader plate 240. In one embodiment, the side walls 226, front wall 227 and rear wall as well as the top cover 222 are formed from aluminum. Alternatively, these portions of the top compartment 220 may be may be formed of any rigid material including, but not limited to, steel, and plastics. Preferably, side walls 226 are sized to extend the entire combined height of the top compartment 220 and cooling assembly 230. Front wall 227 and rear wall are preferably sized to extend the height of the top compartment 220. An upper portion of side walls 226, front wall 227, the back wall, top cover 22 and heat spreader plate 240 cooperate to form the sealed top compartment 220 for housing the electronic circuit 210. In another embodiment, the top compartment 220 may not be sealed, but may instead be open to the environment. The various parts which form the top compartment 220 may be coupled together using screws or other fastener types that may require special tools for removal. Additionally, the screw fasteners may be augmented by other self-aligning/locking mechanical components. By utilizing screw fasteners or other removable fasteners, the top compartment 220 may be opened as necessary to provide service to the electronics housed inside. Alternatively, the compartment structures, or a substructure therein, may be formed by milling or casting a single piece of material such as aluminum, steel or plastic. Another alternative includes welding the elements comprising the top compartment 220 together to form a solid enclosure. However, while welding may increase structural stability, it decreases the enclosure's 200 serviceability.

The cooling assembly 230 is coupled to the bottom of top compartment 220 and further includes a passive radiator 232 (here illustrated in one embodiment 232a) and a bottom plate 234. The passive radiator 232 and bottom plate 234 are coupled to the cooling assembly 230 in order to draw heat away from the highest dissipation components (the top compartment 220) to a high efficiency heat exchanger (the passive radiator 232).

Figure 5:
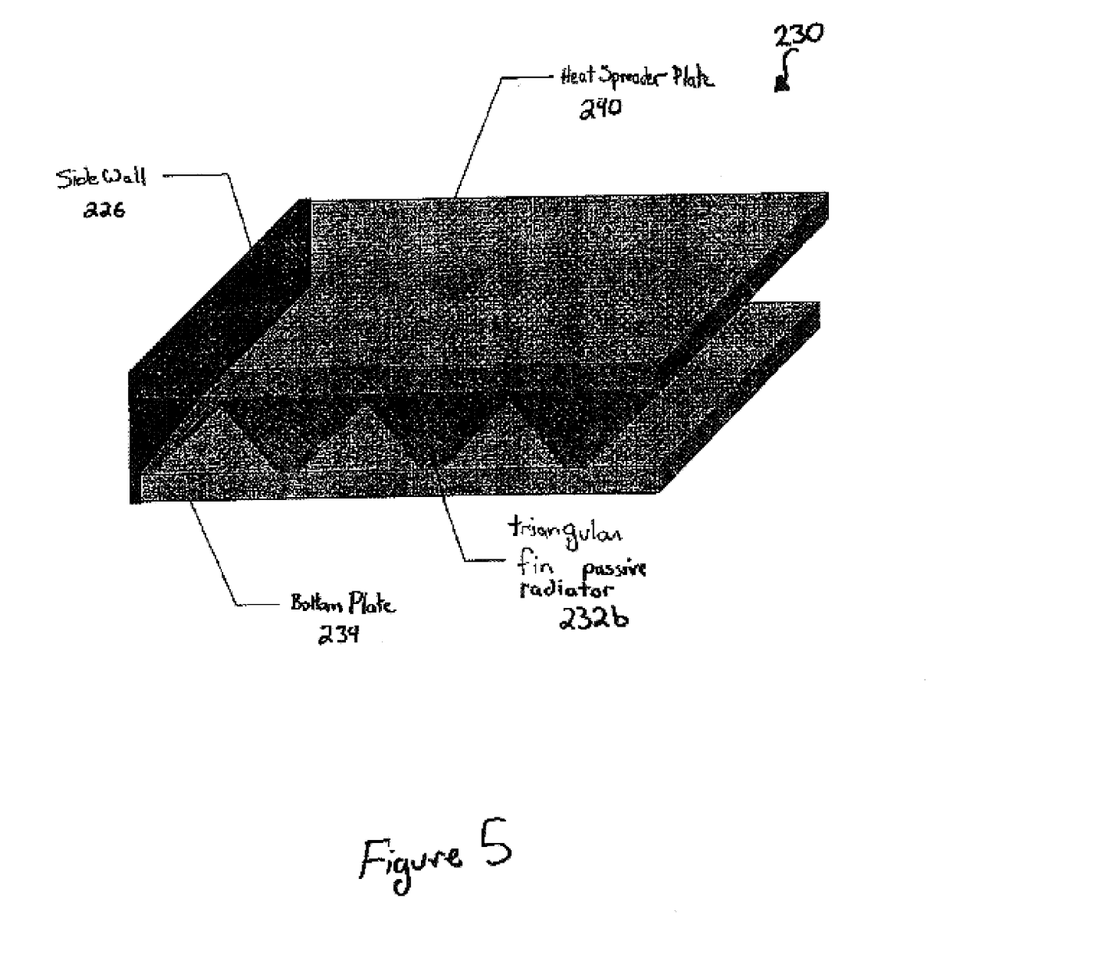
FIG. 5 illustrates a cooling assembly utilizing a triangular fin structure.
Figure 6:
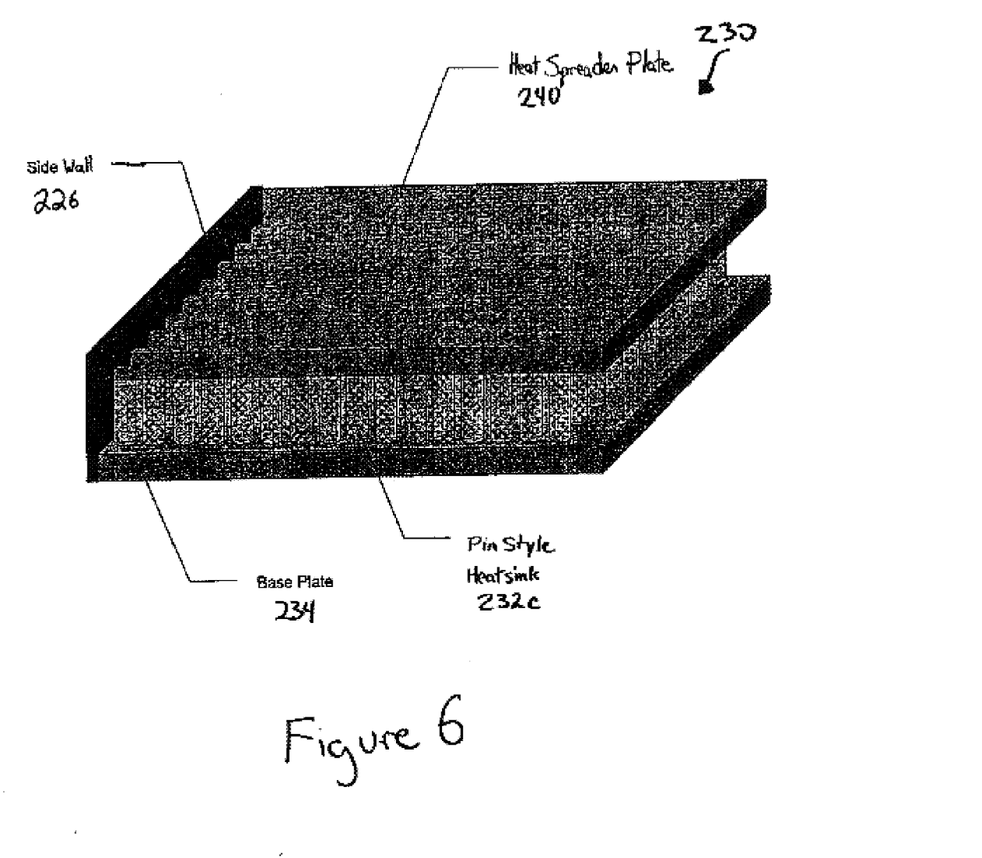
FIG. 6 illustrates a cooling assembly utilizing a pin-style heatsink.

As illustrated, the passive radiator 232 may be formed from an aluminum corrugated fin 232a. As will be discussed below, the use of an aluminum corrugated fin 232a provides specific advantages over other passive radiators, however, one skilled in the art will recognize that other passive radiators may be used in place of the corrugated fin 232a, as well as that the radiator 232 may be made from other material aside from aluminum. For example, the passive radiator may be formed from copper, carbon fiber, composite structures of aluminum and copper or plastic, and may additionally be used in conjunction with heat-pipes and cold plates. Additionally, other structures aside from a corrugated fin 232a may be used. FIG. 5 illustrates a triangular fin, or A-frame, truss structure 232b preferably formed from aluminum or steel. As will be discussed below, this embodiment of the passive radiator 232 is more difficult and more expensive to manufacture, but provides additional structural integrity to the enclosure 200. FIG. 6 illustrates another embodiment of the passive radiator 232 utilizing pin-style heat-sinks 232c sandwiched between the heat spreader plate 240 and the bottom plate 234. This forms a rigid truss plate structure while allowing some measure of heat dissipation profiling based on the placement and density of the pins.

In general, heat spreader plate 240, a lower portion of side walls 226, and bottom plate 234 cooperate to "sandwich" the passive radiator 232 into a solid rigid truss plate structure. The truss plate structure achieves a high strength to weight ratio by converting bending mode forces, applied to opposing plates, into compression and extension mode forces. This is similar to plates formed from conventional honey-comb or sandwich construction. However, unlike conventional "honey-comb" or sandwich construction, the present invention provides ducts or passageways through which cooling air (or other cooling fluid) is allowed to flow to aid in the efficient removal of heat from the top compartment 220.

The cooling assembly 230 may be assembled in a number of ways, with one goal being to keep the assembly process simple, while preserving structural rigidity and allowing the effective transfer of heat from the base-plate to the passive radiator 232. One way of doing this with a metallic passive radiator 232 is through welding. If a non-metallic passive radiator 232 is used, a thermally conductive adhesive may be used.

As illustrated, electronic circuit 210 is a compute element and includes a PCB 212, a plurality of processors 214 coupled to a front of the PCB 212, and a plurality of memory components 216 electrically coupled to a back of PCB 212. A thermal interposer 224a is positioned to contact the back of PCB 212 and the memory components 216 to provide a heat exchange between PCB 212 and memory components 216. Typically, the interposer 224 is made up of a resilient plastic material, doped with a thermally conductive and insulating compound such as aluminum oxide, boron nitride or other materials. Alternatively, the interposer 224 may be formed from a gel or a foam. Alternatively, the top compartment 220 may be filled with thermally conductive foam. While this alternative provides structure and heat removal, it is not preferred due to the permanent nature of the installation. A removable interposer 224 is preferred to aid in the keeping the electronics inside the top compartment 220 serviceable.

As will be discussed in greater detail below, processors 214 and PCB 212 are positioned within top compartment 220 such that processors 214 are placed in physical contact with heat spreader plate 240, allowing for heat to be conducted away from processors 214. Alternatively, a heat conducting material, such as a thermal interposer similar to interposer 224, may be position between the processors 214 and the heat spreader plate 240. A second thermal interposer 224 is positioned between the memory components 216 and the top cover 222. Top compartment 220 is preferably sized to provide just enough vertical and horizontal room to fit electronic circuit 210 within its confines. In a preferred embodiment, thermal interposers 224 are created from a resilient material which is slightly compressed to ensure a "snug" fit for the electronic circuit 210 within top compartment 220. By ensuring that the thermal interposers 224 make tight contact with the top cover 222, additional thermal and structural benefits are realized.

Figure 3:
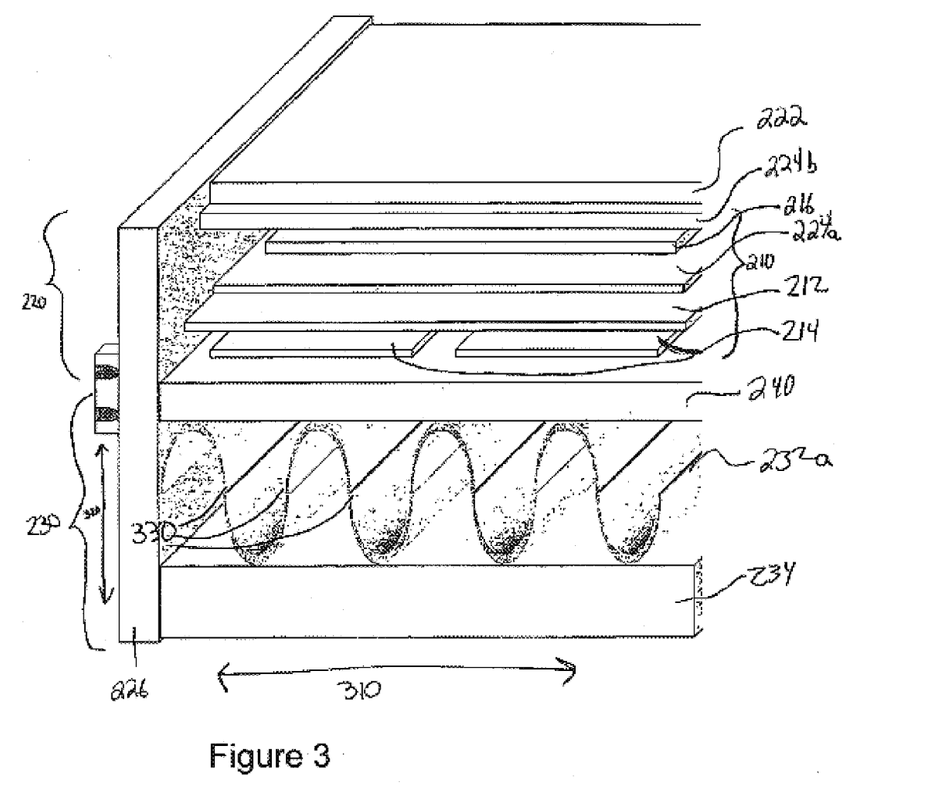
FIG. 3 illustrates a cut-away structural detail of the assembled ruggedized electronics enclosure according to one embodiment of the present invention.

FIG. 3 illustrates a cut-away structural detail of the assembled ruggedized electronics enclosure 200. As introduced in FIG. 2, in one embodiment, the electronic circuit 210 housed in the top compartment 220 is again a compute element. One of the objectives for the ruggedized electronics enclosure 200 is to provide protection to the electronic circuit 210 housed in the top compartment 220 from harsh operating environments. As noted above, the top compartment 220 may be completely sealed by appropriately sizing the side walls 226, front wall 228 (not shown), back wall (not shown), top cover 222 and heat spreader plate 240 to ensure that no open spaces exist in the top compartment 220 surface.

In addition to being able to make the top compartment 220 airtight, additional steps may be made to "ruggedize" the enclosure 200 to help reduce the effects of destructive shock events and destructive vibration events on the electronic circuit 210 housed within. A destructive shock event is any shock event that may render the electronic circuit 210 or enclosure 200 inoperative due to a large change in force and momentum being applied to the circuit 210 and enclosure 200. The circuit 210 or enclosure 200 may be rendered inoperative after a single destructive shock event or after a series of destructive shock events occurring between maintenance intervals. Examples of destructive shock events include impacts and explosions from bombs, missiles, other military ordinance, water craft hitting depth charges, aircraft hitting air pockets, wheeled vehicles hitting potholes as well as other impacts typically encountered by military or commercial vessels. One skilled in the art will recognize that other destructive shock events exist and that the above list provides only a general context for the nature of a destructive shock event.

Similarly, a destructive vibration event is any vibration event that may cause the electronic circuit 210 or enclosure 200 to fail due to a weakened structural integrity. Destructive vibration events may be isolated and short-lived in duration or may always be present in the operating environment. Examples of destructive vibration events include engine vibrations, turbine vibrations, screw vibrations, prolonged shock events, travel along uneven surfaces etc. One skilled in the art will recognize that other destructive vibration events exist and that the above list provides only a basic context for the nature of a destructive vibration event.

In typical military applications, the electronic circuit 210 must be able to survive and continue to operate efficiently after being subjected to an 60 G shock or constant vibration from engines and other movement. Military specifications MIL810, MIL901, MIL167 and ISO10055 provide specific requirements for shock and vibration resistance depending on the desired application and are incorporated in their entireties herein. Typically, the individual chip-level components used in a standard commercial environment will withstand up to an 60 G shock load. This is due in part to the fact that the interconnects and silicon are packaged such that there is high structural rigidity in the component. However, one concern is with the printed circuit board (PCB) and its assembly. To minimize the shock impact to the PCB and the solder connections, it is beneficial to have structural ties between the board and its components and cooling assembly 230.

One design goal is to make the entire enclosure assembly one rigid structural element in order to protect against destructive shock and vibration events. In one embodiment, the enclosure is rigidified by the truss plate structure in order to protect the electronic circuit against an anticipated destructive shock event. In one embodiment, the enclosure and circuit can withstand and survive a 60 G shock event. In alternate embodiments the enclosure is designed based upon various criteria (e.g., materials, mass, truss plate, dimensions, assembly methods, etc.) such that a particular enclosure and enclosed device (e.g., circuit) is designed to withstand and survive shock events in the range of 20 G to at least 60 G depending upon these design criteria.

One aspect of forming the enclosure 200 as a rigid structural element includes raising the enclosure's 200 resonant frequency to a frequency higher than the destructive vibration events to which the enclosure 200 will be subject. Two major factors that affect the resonant frequency of a given structure are the mass, and the material's inherent stiffness. Typically, the lower the mass, the higher the resonant frequency. Thus, the overall mass of the enclosure 200 helps determine the resonant frequency of the enclosure 200 as well as its susceptibility to vibrational damage. Also, the higher the material stiffness, the higher the resonant frequency. As noted above, from a vibration standpoint, it is desirable to have the resonant frequency above the frequencies of any anticipated destructive vibration events to keep the mechanical structure from adding to the vibration energy.

Thus, the enclosure 200 is formed from a material that balances stiffness and mass to provide an overall high resonant frequency which is higher than the anticipated destructive vibration event frequencies. In the preferred embodiment, the ruggedized enclosure 200 is composed primarily of aluminum. The use of aluminum offers a good compromise between strength needed to protect the electronic circuit 210, while providing a lower total mass for the enclosure. As will be discussed below, the use of aluminum also provides an efficient way of removing heat generated by the electronic circuit 210. In one embodiment, the enclosure 200 is designed to have a resonant frequency that is at least approximately twice the 12–25 Hz frequency of naval shock events. In an alternate embodiment, the enclosure 200 has a resonant frequency in the range of hundreds of Hz, to protect the enclosure against an aircraft's prop or turbine vibrations. The specific resonant frequency chosen will be dictated by the specific vibrational frequency of the prop or turbine engine used, e.g., between 200 Hz and 1 kHz. These frequencies are merely examples of the resonant frequencies supported by the present invention. Alternate embodiments will have a resonant frequency selected to be greater than the vibrational frequency of an anticipated shock event that is to be dissipated by the enclosure 200.

Another aspect of the ruggedized enclosure 200 is its overall profile. In a preferred embodiment, the overall vertical height of the enclosure 200 is 1 rack unit ("U") or 1.75 inches. Additionally, in one embodiment, the top compartment 220 is configured to house the electronic circuit 210 snugly, without allowing for significant horizontal or vertical movement within the compartment 220. Further cushioning and insulation from vibration is garnered by the use of the thermal interposers 224 which may be compressed slightly to ensure a snug fit while providing an efficient heat conduit to remove heat from the electronic circuit 210.

Passive radiator 232 provides additional resistance to destructive shock and vibration events. By using a passive radiator and fluid channel structure such as the corrugated fin 232a, the triangular fin 232b, or the pin-style heatsink 232c, a light-weight rigid truss plate structure may be formed from the cooling assembly 230. This structure is stiffened by cross coupling (via the passive radiator 232) between the top compartment 220 and bottom plate 234. By forming the truss plate structure, the passive radiator 232 provides the cooling assembly 230 with structural properties similar to a solid thick plate from a rigidity standpoint for resisting destructive shock and vibration events. While a solid thick plate generally provides additional structural integrity to the enclosure 200, there is a tradeoff between plate thickness and overall mass. As noted above, the resonant frequency of the enclosure 200 would be decreased by the increased mass of a solid plate. By instead using a truss plate structure for the cooling assembly 230, the enclosure 200 retains the benefit of a thick plate while avoiding the lower resonant frequency associated with a thick, heavy plate.

In addition to the passive radiator 232, the interposers act to absorb high frequency vibrations by acting as lossy dissipative elements. The combination of top cover 222, thermal interposers 224, electronic circuit 210, and cooling assembly 230 in a small vertical space helps makes the total enclosure 200 very stiff. Furthermore, the interposers reduce the transfer of energy between the bottom plate 234 and the top cover 222, essentially dissipating the conducted vibrational energy. Additionally, materials used in bottom plate 234, heat spreader plate 240 and top cover 222 may be selected to dissipate mechanical (vibrational) energy. In particular, composite materials can offer a combination of high strength (stiffness) and damping (mechanical energy dissipation).

As noted above, the truss plate structure helps rigidify the enclosure 200 by cross coupling the top compartment 220 and the bottom plate 234. For example, the use of the triangular fin structure 232b or corrugated fin 232a as the passive radiator 232 may also help reduce the effects of destructive shear events and destructive vibration events in the horizontal direction indicated by arrow 310 and in a vertical direction indicated by arrow 320. Using a corrugated fin 232a for the passive radiator 232 provides a good structure to transfer energy in both horizontal and vertical direction. The corrugation directs forces along the axes of the structure. The corrugations may also act to reduce the vibrational energy by acting as a dissipative spring. Tying the corrugations to the top and bottom plate 240, 234 at the peaks stiffens the structure in the "vertical" direction, effectively raising the structure's vertical (or bending mode) resonant frequency.

Figure 4:
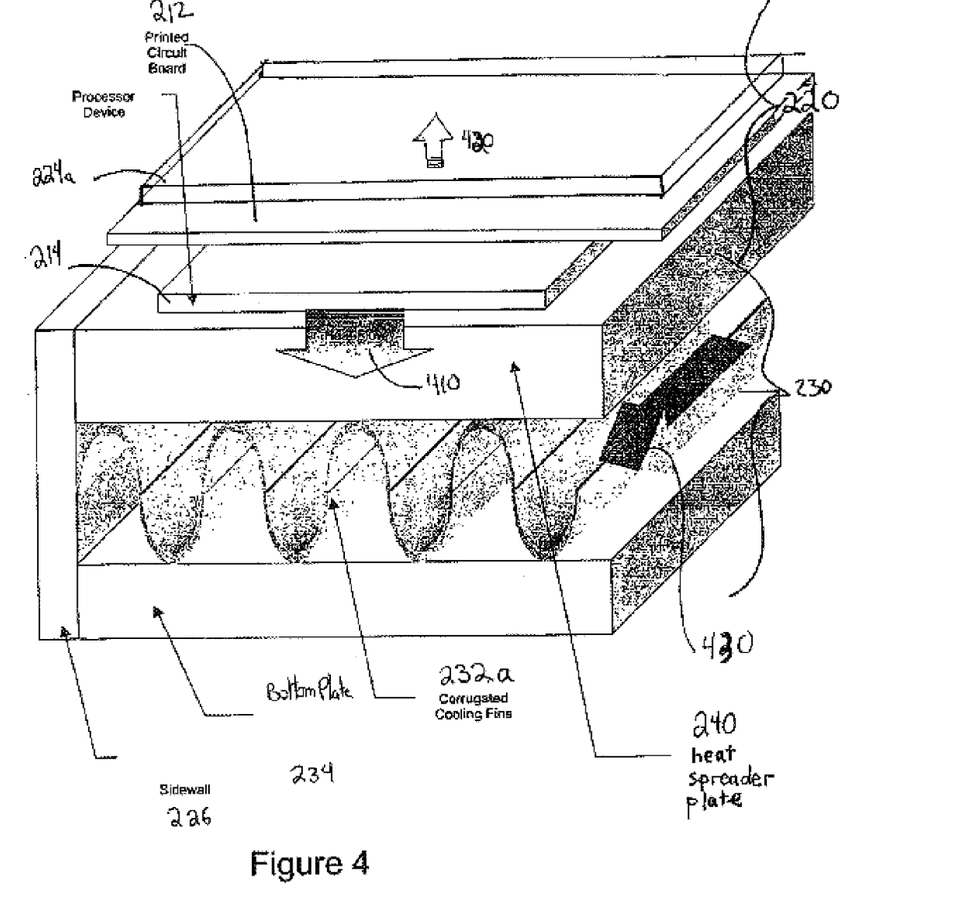
FIG. 4 illustrates a cut-away diagram of the ruggedized electronics enclosure showing heat and airflow related to the enclosure according to one embodiment of the present invention.

FIG. 4 illustrates a cut-away diagram of the ruggedized electronics enclosure showing heat and airflow related to the ruggedized electronics enclosure 200. In FIG. 4, to more clearly illustrate the heatflow and airflow, the top compartment 220 is not fully shown, but it is understood that the cooling assembly 230 is coupled to a top compartment 220 which houses and protects electronic circuit 210 as illustrated in FIG. 2.

FIG. 4 illustrates two directions for heat flow from electronic circuit 210, here illustrated as PCB 212 and processor 214. A primary direction for heat flow is illustrated by an arrow 410. This heat flow is accomplished by putting the processor 214 in thermally conductive contact with heat spreader plate 240. In one embodiment contact may be made by placing the processor 214 in direct contact with the heat spreader plate 240. Alternatively contact may be made by placing a heat conductive medium between the processor 214 and the heat spreader plate 240. Preferably, heat spreader plate 240 has a high thermal conductivity. In a preferred embodiment, processor 214 is oriented to be upside down so that its "top" is pressed against heat spreader plate 240. This arrangement allows for direct heat conduction between processor 214 and heat spreader plate 240. In conventional microchips, the main direction for heat to escape the chip is through its "top". By positioning the top of the processor 214 against the heat spreader plate 240, heat is efficiently conducted from the processor 214 to the heat spreader plate 240. Alternatively, the microchips may face with their "tops" away from the heat spreader plate 240 and a thermal interposer 224 or other thermally conductive medium may be placed between the microchip and the heat spreader plate 240.

Heat spreader plate 240 conducts heat away from the electronic circuit 210 in the direction indicated by arrow 410, and into the passive radiator 232. Passive radiator 232 is designed to radiate the heat conducted from the electronic circuit 210 into the environment. Preferably, passive radiator 232 is exposed to an air flow across its surface area. This air flow is indicated by arrow 430 in FIG. 4. By inducing an air flow 430 through the spaces formed from passive radiator 232 and top and bottom plates 240, 234, heat may be efficiently removed from the electronic circuit 210 and from the ruggedized electronic enclosure 200 in general. Alternatively, the cooling assembly 230 can be mounted vertically to allow the heated air to rise, cooling the assembly through thermally induced convection currents. The specific proportions of passive radiator 232 directly affect its efficiency in removing heat from the enclosure 200. For instance, the overall height and width of a single "segment" directly affects the amount of surface area present for radiating heat, as well as changing the profile of the air channels. The profile of the air channels affects the channel's impedance to airflow and thus, the rate of airflow (for a given pressure differential) through the air channels of the passive radiator 232 and consequently the enclosure 200.

Additionally, for low airflow situations, the cooling assembly 230 is designed to radiate the maximum amount of heat to the ambient air. Increasing the surface area increases the heat transfer between the processor and the air. This may result in a "tighter" corrugation or more transitions between the heat spreader plate 240 and the bottom plate 234. If, however, an externally generated pressure differential is used to induce air movement past the passive radiator 232, then the design may optimize the passageways through the passive radiator 232 for optimum heat transfer at a given pressure differential. The size of the passageways directly affects the impedance of air that may flow across the passive radiator 232. As the passageways decrease in size, the air flow for a given pressure differential, and therefore, the heat transfer efficiency of the cooling assembly 230, will also decrease. Thus, one design goal is to balance the surface area of the passive radiator 232 against the size of the passageways and resultant air flow and heat transfer efficiency. In this way, different operating conditions may be met by adjusting the proportions of the passive radiator 232 to the requirements of the specific application and environment.

As noted above with respect to FIG. 3, the passive radiator 232 also provides shock and vibration protection. These shock and vibration aspects of the passive radiator 232 are also dependent on the proportions of each "segment". It may be necessary to balance the application's need for shock and vibration protection against the operating temperature requirements. Typically, it is required that systems operate at ambient temperature extremes above 50 degrees Celsius. Maximum chip case temperatures measured at the package are commonly specified not to exceed 75 C. For low power devices, this is easily achieved. For higher power devices, the thermal resistance from the electronics to air becomes a significant factor. In the case of higher power devices, a different material may be used for the passive radiator 232 in order to improve the heat transfer to the cooling assembly 230, such as copper or carbon composite materials.

As noted above, heat spreader plate 240 is preferably formed from a material with a high thermal conductivity, such as aluminum. Alternatively, the heat spreader plate 240 may be formed from copper or a carbon composite in order to provide a higher thermal conductivity and improved cooling efficiency at higher rates of airflow. Any type of material may be used for the passive radiator 232 in this alternate embodiment.

Figure 7:
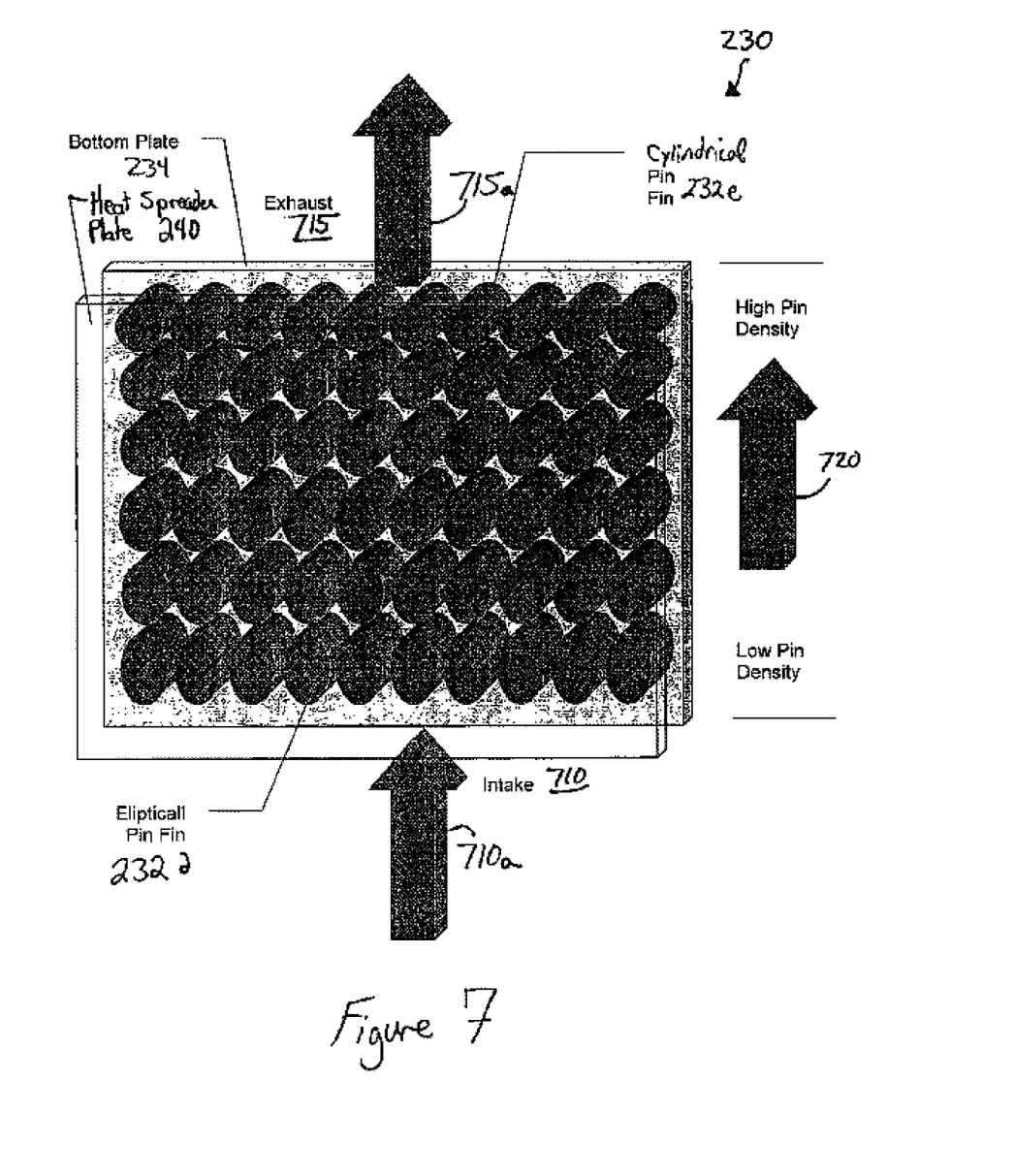
FIG. 7 illustrates a cooling assembly utilizing a pin-style heatsink forming a turbulence gradient.

In one embodiment, heat spreader plate 240 or the passive radiator 232 may be configured to conduct heat from a "hotter" exhaust side 715 of the air channels to a "cooler" inlet side 710, to allow the energy flux into the air channel to stay constant, along an axis of the heat spreader plate 240. This can be accomplished by making the heat spreader plate relatively thicker at the inlet side 710 and thinner at the exhaust side 715. In another embodiment, a turbulence gradient may be achieved by varying the cooling assembly 230 channel capacity, or by varying the pin density of the passive radiator 232, (if a pin-style heat sink similar to pin-style heat sink 232c is used,) by changing the profile of pins, or by any other means. FIG. 7 illustrates a cooling assembly 230 with a turbulence gradient. The cooling assembly 230 has an intake 710 represented by the air-flow arrow 710a and an exhaust 715, represented by arrow 715a. Near the intake 710 of the cooling assembly 230 the passive radiator 232 is comprised of elliptical pin fins 232d. As air moves along the passive radiator 232 from intake 710 to exhaust 715, along a direction indicated by arrow 720, the pressure drop along the direction 720 of airflow is increased. At the exhaust 715 end of the cooling assembly 230, the pin fins 232e are shaped to be more cylindrical, which may be similar to the pin style heat sink 232c. These cylindrical pin-fins 232e induce more turbulence and thus create a higher pressure drop. The varying turbulence caused by changing the pin profile along arrow 720, tends to keep the rate of energy transfer constant, even though the temperature of the air increases from the intake 710 to the exhaust 715 of the cooling assembly 230. This turbulence profiling makes it easier for the heat spreader to maintain an isotherm. The thermal conductivity of the heat spreader can be increased, usually meaning the mass can be reduced, thus allowing the structure's resonant frequency (for flexure modes) to be increased, with no reduction in heat transfer efficiency.

The turbulence profiling described above helps maintain several chips in contact with the heat spreader plate 240 at a similar temperature. This may be especially helpful in the situation where high rates of airflow 430 are induced by an externally generated pressure differential from inlet to exhaust. Referring back to FIG. 4, as the air flows in the direction of arrow 430, it will be heated by passive radiator 232, thereby reducing its effectiveness in cooling the remainder of the passive radiator 232. By designing the turbulence profile to match the changes in airflow temperature, the temperature of the electronic circuit 210 may be maintained. By maintaining a substantially uniform temperature across all components in electronic circuit 210, timing variances due to temperature variations between components may be reduced. This may be especially important if several processors are operating in parallel.

While the above discussion focused primarily on an embodiment of the enclosure 200 which utilizes an air cooled corrugated fin passive radiator 232a, one skilled in the art will recognize that liquids such as sea water or a commercial refrigerant, other gasses such as gaseous nitrogen, may be used to conduct heat away from the passive radiator 232. Alternatively, there may be no liquid or gas present in the system and thermal transfer is achieved by radiation or convection from the external surfaces of the enclosure. One embodiment utilizes a liquid heat exchanger, substituting fluid channels for the passive radiator 232. All the mechanical benefits of the truss plate structure would be retained, and the modest increase in mass would be more than compensated for in heat transfer efficiency. Another embodiment puts the passive radiator in physical contact with a cold wall in an aircraft. Additionally, heat pipes may be embedded in the heat spreader plate 240 to help remove heat to an external heat exchanger. Additionally, while a corrugated fin 232a and a triangular fin truss 232b have proven to be advantageous from a production and structure standpoint, one skilled in the art will recognize that other passive radiators are also contemplated by this disclosure. Examples of other possible passive radiators include punched corrugated fins, conventional fin-style heat sinks that may be coupled to the top and bottom plates 240, 234, honey-comb truss structures oriented to allow air to pass through them, or a solid metal plate with longitudinal channels or holes placed therein.

While the invention has been particularly shown and described with reference to a preferred embodiment and various alternate embodiments, it will be understood by persons skilled in the relevant art that various changes in form and details can be made therein without departing from the spirit and scope of the invention.

What is claimed is:

1. A ruggedized electronics enclosure for housing an electronic circuit comprising:
   a top compartment configured to house the electronic circuit; and
   a cooling assembly comprising a rigid truss plate structure, rigidly coupled to the top compartment and thermally coupled to the electronic circuit, the top compartment, cooling assembly, and electronic circuit providing a rigid structure; that does not substantially deform in response to one or more destructive shock events, to protect the electronic circuit against said one or more destructive shock events.

2. The ruggedized electronics enclosure of claim 1 wherein the rigid truss plate structure is configured to remove heat generated by the electronic circuit and to provide support against destructive vibration events and destructive shock events experienced by the ruggedized electronics enclosure.

3. The ruggedized electronics enclosure of claim 1 wherein the top compartment and cooling assembly form a protective structure with a resonant frequency higher than the frequency of a destructive vibration event.

4. The ruggedized electronics enclosure of claim 3 wherein the resonant frequency of the ruggedized electronics enclosure is in the range of 200 Hz to 1 kHz, for aircraft and land-based applications.

5. The ruggedized electronics enclosure of claim 3 wherein the resonant frequency of the ruggedized electronics enclosure is in the range of 20 Hz to 40 Hz.

6. The ruggedized electronics enclosure of claim 1 wherein the ruggedized electronics enclosure is configured to protect the electronic circuit against a shock event of at least 20 G's.

7. The ruggedized electronics enclosure of claim 1 wherein the ruggedized electronics enclosure is configured to protect the electronic circuit against a shock event of at least 40 G's.

8. The ruggedized electronics enclosure of claim 1 wherein the ruggedized electronics enclosure is configured to protect the electronic circuit against a shock event of at least 60 G's.

9. The ruggedized electronics enclosure of claim 1 wherein the top compartment completely encloses the electronic circuit.

10. The ruggedized electronics enclosure of claim 9 wherein the top compartment is sealed to prevent moisture and particles from entering the top compartment.

11. The ruggedized electronics enclosure of claim 1 wherein the ruggedized electronics enclosure is formed from a material with a low mass and high stiffness to increase the resonant frequency of the enclosure.

12. The ruggedized electronics enclosure of claim 11 wherein the ruggedized electronics enclosure is substantially formed from aluminum.

13. The ruggedized electronics enclosure of claim 1 wherein the cooling assembly and top compartment cooperate to form a structure with a low vertical profile.

14. The ruggedized electronics enclosure of claim 1 wherein:
   the top compartment comprises a heat spreader plate coupled to the cooling assembly; and
   the cooling assembly comprises:
      a bottom plate; and
      a passive radiator coupled to the heat spreader plate and to the bottom plate to form the rigid truss plate structure.

15. The ruggedized electronics enclosure of claim 14 wherein the cooling assembly is configured to allow air to pass through a passageway formed by the heat spreader plate, bottom plate, and the passive radiator.

16. The ruggedized electronics enclosure of claim 14 wherein the passive radiator comprises a corrugated fin.

17. The ruggedized electronics enclosure of claim 16 wherein the corrugated fin is formed from one of copper, aluminum or composite materials.

18. The ruggedized electronics enclosure of claim 16 wherein the corrugated fin provides support against destructive shear forces in the horizontal plane and provides support against destructive twisting and flexing of the ruggedized electronics enclosure.

19. The ruggedized electronics enclosure of claim 14 wherein the passive radiator comprises a triangular fin structure.

20. The ruggedized electronics enclosure of claim 19 wherein the triangular fin structure provides support against destructive shear forces in the horizontal plane and provides support against destructive twisting and flexing of the ruggedized electronics enclosure.

21. The ruggedized electronics enclosure of claim 14 wherein the passive radiator comprises a plurality of pin-style heatsinks.

22. The ruggedized electronics enclosure of claim 21 wherein the pin-style heatsinks are arranged in a pattern of varying pin density, or profile, to form a turbulence gradient and configured to provide an even heat dissipation across the heat spreader plate.

23. The ruggedized electronics enclosure of claim 21 wherein the heat spreader plate varies in thickness to provide an even temperature distribution across the heat spreader plate.

24. The ruggedized electronics enclosure of claim 14 wherein the cooling assembly further comprises heat pipes configured to draw heat away from the cooling assembly to a point external to the ruggedized electronics enclosure.

25. The ruggedized electronics enclosure of claim 1 wherein the top compartment further comprises a thermal interposer configured to remove heat from the electronic circuit.

26. A ruggedized electronics enclosure comprising:
an enclosure means for housing and protecting an electronic circuit; and
an external cooling means having a rigid truss plate structure, rigidly coupled to the enclosure means and thermally coupled to the electronic circuit for rigidifying the electronics enclosure, said electronics enclosure does not substantially deform in response to destructive shock events and destructive vibration events, and for transferring heat generated by the electronic circuit.

27. The ruggedized electronics enclosure of claim 26 wherein the external cooling means comprises a passive radiator.

28. The ruggedized electronics enclosure of claim 26 wherein the external cooling means receives an externally induced air flow to aid in heat transfer.

29. The ruggedized electronics enclosure of claim 26 wherein the enclosure means and external cooling means raise the resonant frequency of the ruggedized electronics enclosure above the frequency of a destructive vibration event.

30. The ruggedized electronics enclosure of claim 29 wherein the resonant frequency of the ruggedized electronics enclosure is in the range of 200 Hz to 1 kHz, for land based and aircraft applications.

31. The ruggedized electronics enclosure of claim 29 wherein the resonant frequency of the ruggedized electronics enclosure is in the range of 20 Hz to 40 Hz, for shipboard applications.

32. The ruggedized electronics enclosure of claim 26 wherein the ruggedized electronics enclosure is configured to fully protect the electronic circuit from a destructive shock event of at least 20 G's.

33. The ruggedized electronics enclosure of claim 26 wherein the ruggedized electronics enclosure is configured to protect the electronic circuit against a shock event of at least 40 G's.

34. The ruggedized electronics enclosure of claim 26 wherein the ruggedized electronics enclosure is configured to protect the electronic circuit against a shock event in the range of at least 60 G's.

35. The ruggedized electronics enclosure of claim 26 wherein the cooling means further provides protection against destructive shear forces.

36. The ruggedized electronics enclosure of claim 26 wherein the enclosure means further comprises a thermal interposer means for transferring heat away from the electronic circuit and for dissipating vibrations events.

37. A method of housing and protecting an electronic circuit in a ruggedized electronics enclosure comprising:
enclosing the electronic circuit in a top compartment;
externally cooling the electronic circuit with a rigid cooling assembly and
rigidifying the electronics enclosure by rigidly coupling the cooling assembly comprising
rigid truss plate structures to the top compartment, wherein said rigidified electronics enclosure does not substantially deform in response to one or more destructive shock events.

38. The method of claim 37 wherein the step of rigidifying comprises the step of sharing a common structural plate, and side walls, between the top compartment and the rigid cooling assembly.

39. The method of claim 37 wherein:
the cooling assembly comprises a passive radiator; and
the step of cooling comprises conducting the heat generated by the electronic circuit to the passive radiator.

40. The method of claim 37 wherein the step of cooling includes receiving an external air flow to aid in dissipating the heat.

41. The method of claim 37 further includes raising the resonant frequency of the ruggedized electronics enclosure above the frequency of a destructive vibration event by selecting the mass and rigidity of the top compartment and cooling assembly and their materials.

42. The method of claim 41 wherein the resonant frequency of the ruggedized electronics enclosure is in the range 200 Hz to 1 kHz, for land-based aircraft applications.

43. The method of claim 37 wherein the resonant frequency of the ruggedized electronics enclosure is in the range of 20 Hz to 40 Hz, for shipboard applications.

44. The method of claim 37 wherein the ruggedized electronics enclosure fully protects the electronic circuit from a destructive shock event of at least 20 G's.

45. The ruggedized electronics enclosure of claim 37 wherein the ruggedized electronics enclosure is configured to protect the electronic circuit against a shock event of at least 40 G's.

46. The ruggedized electronics enclosure of claim 37 wherein the ruggedized electronics enclosure is configured to protect the electronic circuit against a shock event at least 60 G's.

47. The method of claim 37 wherein the cooling assembly provides protection against shear force.

48. A ruggedized electronics enclosure for housing an electronic circuit comprising:
a top compartment configured to house the electronic circuit; and
a cooling assembly rigidly comprising a truss plate structure, coupled to the top compartment and thermally coupled to the electronic circuit, the top compartment and cooling assembly forming a rigid structure with a resonant frequency greater than the frequency of a destructive vibration event, wherein said rigid structure does not substantially resonate in response to said destructive vibration event.

49. The ruggedized electronics enclosure of claim 48 wherein the ruggedized electronics enclosure is configured to protect the electronic circuit against a shock event of at least 20 G's.

50. The ruggedized electronics enclosure of claim 48 wherein the ruggedized electronics enclosure is configured to protect the electronic circuit against a shock event of at least 40 G's.

51. The ruggedized electronics enclosure of claim 48 wherein the ruggedized electronics enclosure is configured to protect the electronic circuit against a shock event of at least 60 G's.

52. The ruggedized electronics enclosure of claim 48 wherein the top compartment and cooling assembly provide a structure to protect the electronic circuit from at least one destructive shock event.

53. The ruggedized electronics enclosure of claim 48 wherein the top compartment completely encloses the electronic circuit.

54. The ruggedized electronics enclosure of claim 53 wherein the top compartment is sealed to prevent moisture and particles from entering the top compartment.

55. The ruggedized electronics enclosure of claim 48 wherein the resonant frequency of the ruggedized electronics enclosure is in the range of 200 Hz-1 kHz for aircraft and land-based applications.

56. The ruggedized electronics enclosure of claim 48 wherein the resonant frequency of the ruggedized electronics enclosure is in the range of 20 Hz to 40 Hz for shipboard applications.

57. The ruggedized electronics enclosure of claim 48 wherein the ruggedized electronics enclosure is formed from a material with a low mass and high stiffness to increase the resonant frequency of the enclosure.

58. The ruggedized electronics enclosure of claim 57 wherein the ruggedized electronics enclosure is substantially formed from aluminum.

59. The ruggedized electronics enclosure of claim 48 wherein the cooling assembly and the top compartment cooperate to form a low-vertical-profile structure.

60. The ruggedized electronics enclosure of claim 48 wherein:
   the top compartment comprises a heat spreader plate coupled to the cooling assembly; and
   the cooling assembly comprises:
      a bottom plate; and
      a passive radiator coupled to the heat spreader plate and to the bottom plate to form the rigid truss plate structure.

61. The ruggedized electronics enclosure of claim 60 wherein the cooling assembly is configured to allow air to pass through a passageway formed by the heat spreader plate, bottom plate and the passive radiator.

62. The ruggedized electronics enclosure of claim 60 wherein the rigid truss plate structure is configured to radiate heat generated by the electronic circuit and to provide support against a destructive vibration event or a destructive shock event experienced by the ruggedized electronics enclosure.

63. The ruggedized electronics enclosure of claim 60 wherein the passive radiator comprises a corrugated fin.

64. The ruggedized electronics enclosure of claim 63 wherein the corrugated fin is formed from either copper, aluminum or carbon composites.

65. The ruggedized electronics enclosure of claim 63 wherein the corrugated fin provides support against destructive shear forces in the horizontal plane and provides support against destructive twisting and flexing of the ruggedized electronics enclosure.

66. The ruggedized electronics enclosure of claim 60 wherein the passive radiator comprises a triangular fin structure.

67. The ruggedized electronics enclosure of claim 66 wherein the triangular fin structure provides support against shear forces in the horizontal plane and provides support against twisting and flexing of the ruggedized electronics enclosure.

68. The ruggedized electronics enclosure of claim 60 wherein the passive radiator comprises a plurality of pin-style heatsinks.

69. The ruggedized electronics enclosure of claim 68 wherein the pin-style heatsinks are arranged in a pattern of varying pin density to form a turbulence gradient and configured to provide an even heat dissipation across the heat spreader plate.

70. The ruggedized electronics enclosure of claim 60 wherein the heat spreader plate varies in thickness to form a thermal gradient to provide an even heat dissipation across the heat spreader plate.

71. The ruggedized electronics enclosure of claim 60 wherein the cooling assembly further comprises heat pipes configured to draw heat away from the cooling assembly to a point external to the ruggedized electronics enclosure.

* * * * *

UNITED STATES PATENT AND TRADEMARK OFFICE
CERTIFICATE OF CORRECTION

PATENT NO. : 6,765,793 B2
DATED : July 20, 2004
INVENTOR(S) : William E. Kehret and Dennis H. Smith It is certified that error appears in the above-identified patent and that said Letters Patent is hereby corrected as shown below:

Title page,
Item [73], Assignee, please replace "Themis Corporation" with -- Themis Computer --.
Item [57], ABSTRACT,
Line 2, please replace the word "electronics" with -- electronic --.

Column 15,
Line 56, add -- a -- before the word "rigid".
Line 56, replace "structures" with -- structure, --.

Column 16,
Line 11, add -- and -- before the word "aircraft".
Line 27, replace "force" with -- forces --.

Signed and Sealed this

Eighteenth Day of January, 2005

JON W. DUDAS
*Director of the United States Patent and Trademark Office*